US009918382B2

United States Patent
Al-Saud et al.

(10) Patent No.: US 9,918,382 B2
(45) Date of Patent: Mar. 13, 2018

(54) PATTERNED METALLIZATION HANDLE LAYER FOR CONTROLLED SPALLING

(71) Applicants: International Business Machines Corporation, Armonk, NY (US); King Abdulaziz City for Science and Technology, Riyadh (SA)

(72) Inventors: Turki bin Saud bin Mohammed Al-Saud, Riyadh (SA); Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignees: International Business Machines Corporation, Armonk, NY (US); KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 0 days.

(21) Appl. No.: 15/646,881

(22) Filed: Jul. 11, 2017

(65) Prior Publication Data
US 2017/0311436 A1    Oct. 26, 2017

Related U.S. Application Data

(62) Division of application No. 14/877,359, filed on Oct. 7, 2015, now Pat. No. 9,713,250, which is a division (Continued)

(51) Int. Cl.
H05K 1/03    (2006.01)
H05K 1/02    (2006.01)
(Continued)

(52) U.S. Cl.
CPC ........... *H05K 1/028* (2013.01); *H01L 21/304* (2013.01); *H01L 31/1892* (2013.01);
(Continued)

(58) Field of Classification Search
CPC ........ H05K 1/028; H05K 1/0271; H05K 1/09; H05K 1/092; H05K 1/11; H05K 1/111; H01L 21/304; H01L 31/1892
(Continued)

(56) References Cited

U.S. PATENT DOCUMENTS

| 6,452,091 B1 | 9/2002 | Nakagawa et al. |
| 6,802,926 B2 | 10/2004 | Mizutani et al. |

(Continued)

OTHER PUBLICATIONS

List of IBM Patents or Patent Applications Treated as Related dated Jul. 11, 2017, 2 pages.

*Primary Examiner* — Tremesha S Willis
(74) *Attorney, Agent, or Firm* — Scully, Scott, Murphy & Presser, P.C.; Louis J. Percello, Esq.

(57) ABSTRACT

A handle substrate having at least one metallization region is provided on a stressor layer that is located above a base substrate such that the at least one metallization region is in contact with a surface of the stressor layer. An upper portion of the base substrate is spalled, i.e., removed, to provide a structure comprising, from bottom to top, a spalled material portion of the base substrate, the stressor layer and the handle substrate containing the at least one metallization region in contact with the surface of the stressor layer.

20 Claims, 4 Drawing Sheets

Related U.S. Application Data of application No. 14/581,445, filed on Dec. 23, 2014, now Pat. No. 9,578,736.

(51) Int. Cl.
   *H05K 1/09* (2006.01)
   *H01L 31/18* (2006.01)
   *H01L 21/304* (2006.01)
   *H05K 1/11* (2006.01)

(52) U.S. Cl.
   CPC .............. *H05K 1/0271* (2013.01); *H05K 1/09* (2013.01); *H05K 1/092* (2013.01); *H05K 1/11* (2013.01); *H05K 1/111* (2013.01)

(58) Field of Classification Search
   USPC .................. 174/250, 251, 255–259, 261, 262
   See application file for complete search history.

(56) References Cited

U.S. PATENT DOCUMENTS

| | | |
|---|---|---|
| 8,247,261 B2 | 8/2012 | Bedell et al. |
| 2010/0101627 A1 | 4/2010 | Patel |
| 2011/0277813 A1 | 11/2011 | Rogers et al. |
| 2011/0290296 A1 | 12/2011 | Daniel et al. |
| 2011/0290304 A1 | 12/2011 | Daniel |
| 2012/0217622 A1 | 8/2012 | Bedell et al. |
| 2013/0005116 A1 | 1/2013 | Bedell et al. |

PATTERNED METALLIZATION HANDLE LAYER FOR CONTROLLED SPALLING

BACKGROUND

The present application relates to semiconductor manufacturing. More particularly, the present application relates to a method of removing a material portion of a base substrate utilizing a controlled spalling process in which a handle substrate is used that contains metallization regions. The present application also relates to a structure that can be formed from such a method.

Devices such as, for example, photovoltaic and electro-optical, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a base substrate. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

Recent advancements in the area of high-efficiency, lightweight, flexible photovoltaic (PV) devices has opened the door to a new class of solar energy products. The controlled spalling process mentioned above can be used for transferring thin layers of III-V compound semiconductor materials from a rigid host substrate to a lightweight flexible substrate.

When multiple PV devices are integrated into a single flexible substrate, it is important that the electrical connections that link these devices do not deleteriously affect the performance of the multi-device module. In early prototypes of these flexible modules, it was found that high series resistance resulting from the use of commercially available flexible conductors (such as, for example, Ag-based inks) severely limited the performance of the module. As such, there is a need to provide a PV module design that can maximize mechanical flexibility, minimize weight and allow for low electrical resistance contact between adjacent PV devices.

SUMMARY

A handle substrate having at least one metallization region is provided on a stressor layer that is located above a base substrate such that the at least one metallization region is in contact with a surface of the stressor layer. An upper portion of the base substrate is spalled, i.e., removed, to provide a structure comprising, from bottom to top, a spalled material portion of the base substrate, the stressor layer and the handle substrate containing the at least one metallization region in contact with the surface of the stressor layer.

In one aspect of the present application, a method of forming a structure is provided. In one embodiment of the present application, the method includes forming a stressor layer atop a base substrate. A handle substrate having at least one metallization region is provided on the stressor layer such that the at least one metallization region is in contact with a surface of the stressor layer. An upper portion of the base substrate is spalled, i.e., removed, to provide a structure comprising, from bottom to top, a spalled material portion of the base substrate, the stressor layer and the handle substrate containing the at least one metallization region in contact with the surface of the stressor layer.

In another aspect of the present application, a structure is provided that includes a spalled material portion of a base substrate. A stressor layer is located above the spalled material portion of the base substrate. A handle substrate containing at least one metallization region is located on the stressor layer, wherein the at least one metallization region is in contact with a surface of the stressor layer.

DETAILED DESCRIPTION

Figure 1:
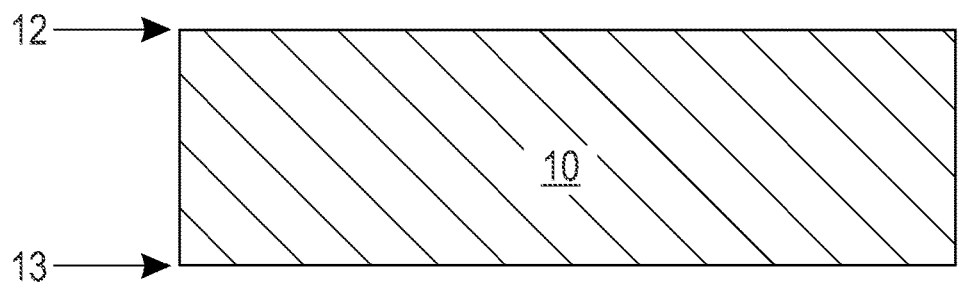
FIG. 1 is a cross sectional view of an exemplary structure including a base substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As used herein, a controlled spalling process is a layer transfer technology that uses mechanically guided fracture to separate a surface layer from a base substrate. The spalling process works by first forming a stressor layer, e.g., a Ni layer, on a surface of a base substrate. A handle substrate is then attached to the surface of the stressor layer. By using the handle layer to initiate and guide the fracture front that forms below the upper surface of the base substrate, a simple and robust layer transfer process can be achieved. Unlike previous spalling processes, the handle substrate contains metallization regions which can be located within and/or on a surface of the handle substrate.

Referring first to FIG. 1, there is illustrated an exemplary structure including a base substrate 10 that can be employed in accordance with an embodiment of the present application. The base substrate 10 includes a first surface (i.e., topmost surface) 12 and a second surface (i.e., bottommost surface) 13 that is opposite the first surface 12.

The base substrate 10 that can be employed in the present application may comprise a semiconductor material, a glass, a ceramic or any another material or combination of materials whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, compounds semiconductor such as, for example III-V compound semiconductors or II-VI compound semiconductor. In some embodiments, the base substrate 10 can be a III-V compound semiconductor such as, for example, GaSb, GaP, GaN, GaAs, InAs, InP, InAsP and AlN. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators. In some embodiments, base substrate 10 comprises a multilayered stack of semiconductor materials. An illustrated example of such a base substrate is a multilayered stack of from bottom to top, a layer of germanium, and a layer of gallium arsenide. When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present application, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be a $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present application, one or more devices (not shown) including, but not limited to, transistors, capacitors, diodes, BiCMOS, resistors, etc. can be processed on and/or within the base substrate 10 utilizing techniques well known to those skilled in the art. An upper region (or portion) of the base substrate 10 which may include the one or more devices can be removed utilizing a mechanical layer transfer process known as spalling. In some embodiments of the present application, the upper region of the base substrate 10 may also include one or more III-V compound semiconductor layers which can be used as a photovoltaic device.

In some embodiments of the present application, the first surface 12 of the base substrate 10 can be cleaned prior to further processing to remove surface oxides and/or other contaminants therefrom. In one embodiment of the present application, the first surface 12 of the base substrate 10 is cleaned by applying to the first surface 12 of the base substrate 10 a solvent such as, for example, acetone and isopropanol, which is capable of removing contaminates and/or surface oxides from the first surface 12 of the base substrate 10.

In some embodiments of the present application, the first surface 12 of the base substrate 10 can be made hydrophobic by oxide removal prior to use by dipping the first surface 12 of the base substrate 10 into hydrofluoric acid. A hydrophobic, or non-oxide, surface provides improved adhesion between the cleaned surface and certain stressor layers to be deposited.

Figure 2:
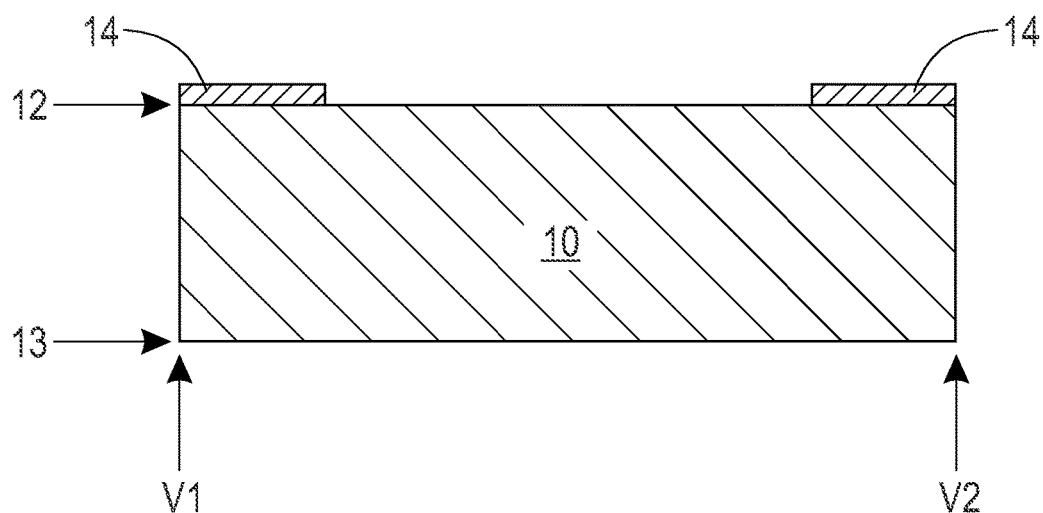
FIG. 2 is a cross sectional view of the exemplary structure of FIG. 1 after forming an edge exclusion material at the edges of the base substrate in accordance with another embodiment of the present application.
Figure 3:
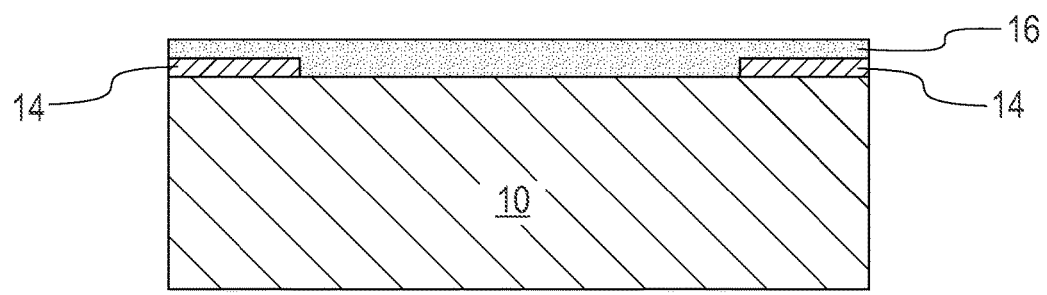
FIG. 3 is a cross sectional view of the exemplary structure of FIG. 2 after forming a metal-containing adhesion layer on exposed surfaces of the edge exclusion material and the base substrate in accordance with an embodiment of the present application.

Referring now to FIG. 2, there is illustrated the exemplary structure shown in FIG. 1 after forming an edge exclusion material 14 on the first surface 12 and at the vertical edges V1, V2 of the base substrate 10. In some embodiments of the present application, the edge exclusion material can be omitted and the process of the present application proceeds as shown in FIG. 3. In embodiments in which an edge exclusion material 14 is present, the edge exclusion material 14 has one edge that is vertically coincident with vertical edge V1,V2 of the base substrate 10, while another edge of the edge exclusion material 14 is located inward from edge V1,V2 and on the first surface 12 of the base substrate 10.

In one embodiment of the present application, the edge exclusion material 14 can be an adhesion demoter. By "adhesion demoter" it is meant any material that reduces the ability of a subsequently formed optional metal-containing adhesion layer or stressor layer to adhere, i.e., stick, to the first surface 12 of the base substrate 10. The adhesion demoters that can be employed in the present application as the edge exclusion material 14 include, but are not limited to, photoresist materials, polymers, hydrocarbon materials, inks, powders, pastes or non-adherent metals. In one embodiment, the adhesion demoter that can be employed in the present application as the edge exclusion material 14 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and/or aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application as the edge exclusion material 14 can be formed onto the first surface 12 of the base substrate 10 near edges V1, V2 utilizing techniques that are well known in the art. For example, the adhesion demoters that can be employed in the present application as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the base substrate 10 that is located directly beneath the edge exclusion material 14 defines an edge exclusion region whose presence minimizes edge related breakage during a subsequent spalling process. The term "edge exclusion region" is used throughout the present application to denote an area atop the base substrate 10 in which a subsequently formed stressor layer is either not present or if, present, the stressor layer does not significantly adhere to the first surface 12 of the base substrate 10.

Referring now to FIG. 3, there is illustrated the exemplary structure of FIG. 2 after forming an optional metal-containing adhesion layer 16 on exposed surfaces of the edge exclusion material 14 and on exposed portions of the first surface 12 of the base substrate 10. In some embodiments, and when no edge exclusion material 14 is present, the optional metal-containing adhesion layer 16 can be formed directly on the entirety of the first surface 12 of base substrate 10.

The optional metal-containing adhesion layer 16 is employed in embodiments in which the stressor layer to be subsequently formed has poor adhesion to first surface 12 of the base substrate 10. Typically, the metal-containing adhesion layer 16 is employed when a stressor layer comprised of a metal is employed. In some embodiments, an optional plating seed layer (not shown) can be formed directly atop the first surface 12 of the base substrate 10. The optional plating seed layer can be used together with the metal-containing adhesion layer 16 or in lieu thereof. When the optional plating seed layer is employed in conjunction with the edge exclusion material 14, the edge exclusion material 14 is applied to the first surface 12 of the base substrate 10 prior to deposition of the plating seed layer.

The optional metal-containing adhesion layer 16 that can be employed in the present application includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the optional metal-containing adhesion layer 16 typically has a thickness from 5 nm to 300 nm, with a thickness from 100 nm to 150 nm being more typical. Other thicknesses for the optional metal-containing adhesion layer 16 that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni(top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

In accordance with the present application, the optional metal-containing adhesion layer 16 and/or the optional plating seed layer is (are) formed at a temperature which does not effectuate spontaneous spalling to occur within the base substrate 10.

Figure 4:
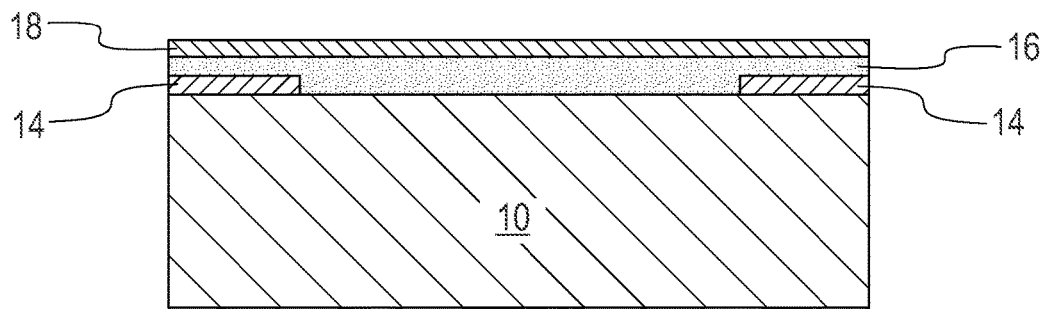
FIG. 4 is a cross sectional view of the exemplary structure of FIG. 4 after forming a stressor layer on a surface of the metal-containing adhesion layer in accordance with an embodiment of the present application.

Referring now to FIG. 4, there is illustrated the exemplary structure of FIG. 3 after forming a stressor layer 18 on an upper surface of the optional metal-containing adhesion layer 16. In some embodiments in which the optional metal-containing adhesion layer 16 is not present, the stressor layer 18 can be formed directly on the first surface 12 of base substrate 10; this particular embodiment is not shown in the drawings, but can readily be deduced from the drawings illustrated in the present application. In other embodiments in which an optional plating seed layer is employed, the stressor layer 18 can be formed directly on the upper surface of the optional plating seed layer; this particular embodiment is also not shown in the drawings, but can readily be deduced from the drawings illustrated in the present application.

The stressor layer 18 that can be employed in the present application includes any material that is under tensile stress on base substrate 10 after deposition. The stressor layer 18 can also be referred to a stress inducing layer. In accordance with the present application, the stressor layer 18 has a critical thickness and a stress value that cause spalling mode fracture to occur within the base substrate 10. In particular, the stressor layer 18 has a critical thickness in which spalling is initiated below the first surface 12 of base substrate 10 and somewhere within the base substrate 10. By 'critical', it is meant that for a given stressor material and base substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, J. *Vac. Sci. Technol.*, 14 (1977) p. 164.

The thickness of the stressor layer 18 is chosen to provide the desired fracture depth somewhere within the base substrate 10. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the base substrate 10 and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an upper surface of the optional metal-containing adhesion layer 16. In another embodiment, the stressor layer 18 is a spall inducing tape, and the spall inducing tape is applied directly to the first surface 12 of the base substrate 10. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, or polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of an upper portion of the base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that is employed in the present application as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 18 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, or plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the first surface 12 of base substrate 10, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 1 µm to 50 µm, with a thickness of from 4 µm to 7 µm being more typical. Other thicknesses for the stressor layer 18 that are below and/or above the aforementioned thickness ranges can also be employed in the present application.

If the stressor layer 18 is of a polymeric nature, it typically has a thickness of from 10 µm to 200 µm, with a thickness of from 50 µm to 100 µm being more typical. Other thicknesses for the stressor layer 18 that are below and/or above the aforementioned thickness ranges can also be employed in the present application.

Figure 5:
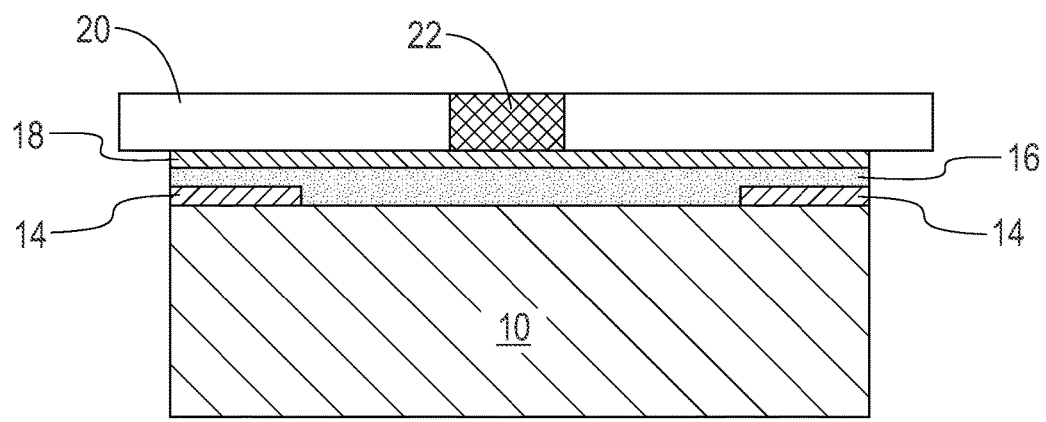
FIG. 5 is a cross sectional view of the exemplary structure of FIG. 4 after forming a handle substrate containing at least one metallization region on a surface of the stressor layer in accordance with an embodiment of the present application.

Referring now to FIG. 5, there is illustrated the exemplary structure of FIG. 4 after forming a handle substrate 20 containing at least one metallization region 22 atop the stressor layer 18. In some embodiments of the present application (and as shown), the metallization region 22 can be embedded within the handle substrate 20. In other embodiments (see, FIG. 8A), the metallization region 22 is located on a surface of the handle substrate 20 that contacts a surface of the stressor layer 18. In yet other embodiments (see, FIG. 8B), a first metallization region can be embedded within handle substrate 20, and a second metallization region can be located on a surface of the handle substrate 18 that contacts a surface of the stressor layer 18. In such an embodiment, the first metallization region is in direct contact with the second metallization region.

In embodiments in which the at least one metallization region 22 is embedded within the material that provides the handle substrate 20, at least one of the surfaces of the at least one metallization region 22 is coplanar with a surface of the material of the handle substrate 22 that makes intimate contact with the surface of the stressor layer 18. In some embodiments, the at least one metallization region 22 can extend partially through the material that provides the handle substrate 20. In other embodiments, the at least one metallization region 22 can extend entirely through the material that provides the handle substrate 20.

Figure 8A:
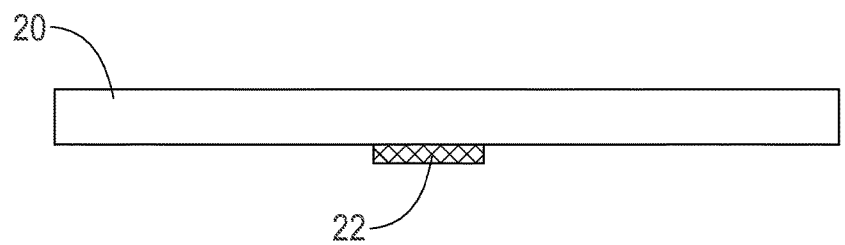
FIGS. 8A and 8B are cross sectional views of other exemplary handle substrates that can be employed in the present application.
Figure 8B:
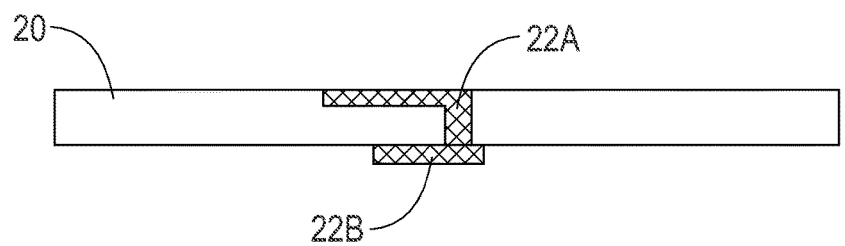

Examples of metallization regions 22 that can be employed in the present application include, but are not limited to, single damascene structures (as shown in FIG. 5), dual damascene structures (one is shown in FIG. 8B), conductive metal pads (see, FIG. 8A), and combinations thereof. The single damascene structure may include a conductively filled via or a conductive filled line, the dual damascene structure may include a conductively filled via and a conductively filled line that are in direct physical contact and in electrical communication with each other. In the illustrated embodiment shown in FIG. 5, and by way of one example, the least one metallization region 22 is a damascene structure that extends entirely through the material that provides the handle substrate 20.

Notwithstanding the type of metallization regions 22 that can be employed in the present application, each metallization region 22 includes a conductive-metal containing material such as, for example, a conductive metal, a conductive metal alloy, a conductive metal nitride or any combination thereof. Examples of conductive metal-containing material that can be employed in the present application in providing the metallization regions 24 include, but are not limited to, Cu, W, Al, AlCu, and CuMn.

In some embodiments of the present application (not shown), a diffusion barrier material liner can be positioned between the metallization region 22 and the material that provides the handle substrate 20. The diffusion barrier liner material can include Co, CoN, CoW, Mo, Mn, Ni, Ir, Pt, Pd, Ta, TaN, Ti, TiN, Ru, RuN, TaRu, TaNRu, Mn, MnN, W, WN, any combination thereof or any other material that can serve as a barrier to prevent a conductive metal or metal alloy from diffusing there through.

The at least one metallization region 22 can be formed utilizing conventional techniques well known those skilled in the art. For example, the metallization region 22 can be formed by first forming an opening (i.e., via and/or line) within the material that provides the handle substrate 20, and thereafter the diffusion barrier material and the conductive metal-containing material can be formed within the opening by utilizing any well known deposition process including, for example, chemical vapor deposition, plasma enhanced chemical vapor deposition, plating or sputtering. A planarization process may follow the deposition processes to remove any unwanted material from the surface of the material that provides the handle substrate 20.

In some embodiments of the present application, the at least one metallization region 22 can be formed by deposition of a conductive-metal containing material on a surface of the material that provides the handle substrate 20 and then the deposited conductive metal-containing material is patterned by lithography and etching. In other embodiments of the present application, and when at least one metallization region 22 is formed on a surface of the handle substrate 20, a conventional lift-off process may be used to provide the at least one metallization region 22.

The at least one metallization region 22 is typically formed prior to forming the handle substrate 20 on the stressor layer 18. In some embodiments, it may be possible to first form the material that provides the handle substrate 20 on the stressor layer 18 and then form the at least one metallization region 22; this embodiment is typically performed when the metallization region includes a single or dual damascene structure.

The material that provides the handle substrate 20 of the present application can include any flexible material which has a minimum radius of curvature of less than 30 cm. Illustrative examples of flexible materials that can be employed as the handle substrate 20 include a metal foil or a polyimide foil.

The handle substrate 20 can be used to provide better fracture control and more versatility in handling the spalled portion of the base substrate 10. Moreover, the handle substrate 20 can be used to guide the crack propagation during the spalling process of the present application. The handle substrate 20 of the present application is typically, but not necessarily, formed at a first temperature which is at room temperature (15° C. (288K)-40° C. (313K)).

The handle substrate 20 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, or plating.

The handle substrate 20 typical has a thickness of from 5 µm to 500 µm, with a thickness of from 10 µm to 150 µm being more typical. Other thicknesses for the handle substrate 20 that are below and/or above the aforementioned thickness ranges can also be employed in the present application.

Figure 9:
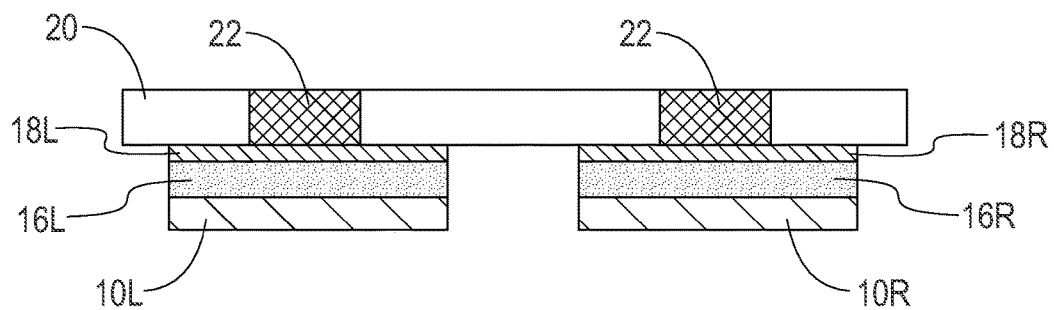
FIG. 9 is a cross sectional view of another exemplary structure that can be formed utilizing the method of the present application.

As shown, the handle substrate 20 typically has a length that extends beyond the length of the base substrate 10. As such, it is possible to process multiple base substrates utilizing a single handle substrate 20. In such an embodiment, metallization regions as described above can be formed in other areas such that these metallization region contacts the stressor layer that is formed above each (or a subset) of the multiple base substrates. Such an embodiment is depicted in FIG. 9 of the present application.

Figure 6:
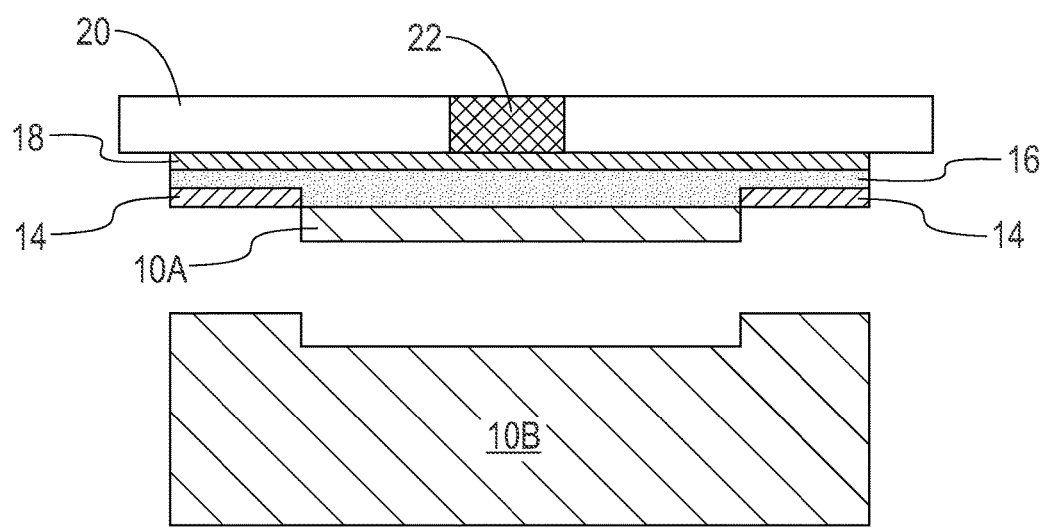
FIG. 6 is a cross sectional view of the exemplary structure of FIG. 5 after performing a spalling process in accordance with an embodiment of the present application.

Referring now to FIG. 6, there is illustrated the exemplary structure of FIG. 5 after removing an upper portion of the base substrate 10 by spalling. In one embodiment of the present application, the spalling process includes pulling or peeling the handle substrate 20 to remove a spalled structure that includes at least the stressor layer 18 and an upper portion of the base substrate 10. The upper portion of the base substrate 10 that is removed by spalling from the original base substrate 10 may be referred herein as a spalled material portion 10A. The remaining portion of the original base substrate 10 may be referred to herein as remaining base substrate portion 10B.

The spalling process includes crack formation and propagation within the base substrate 10. The spalling process is initiated at substantially room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, a structure as shown in FIG. 6 is provided that includes handle substrate 20, stressor layer 18, and, if present the optional plating seed layer and the optional metal-containing adhesion layer 16 and the spalled material portion 10A. In such a structure, at least one metallization region 22 that is associated with the handle substrate 20 remains in contact with a surface of the stressor layer 18. In the present application, the handle substrate 20 including the at least one metallization region 22 can serve as an interconnect level to connect various devices together.

The thickness of the spalled material portion 10A that is removed from the base substrate 10 varies depending on the material of the stressor layer 18 and the material of the base substrate 10 itself. In one embodiment, the spalled material portion 10A that is removed from the base substrate 10 has a thickness of less than 100 microns. In another embodiment, the spalled material portion 10A that is removed from the base substrate 10 has a thickness of less than 50 microns.

Figure 7:
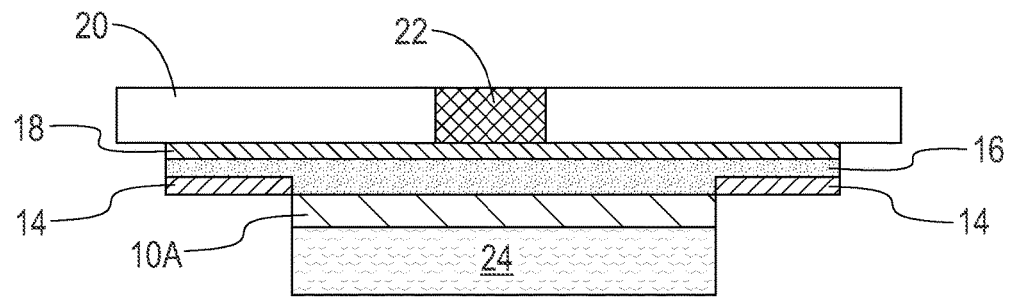
FIG. 7 is a cross sectional view of the exemplary structure of FIG. 6 after bonding a spalled material portion to a substrate in accordance with an embodiment of the present application.

Referring now to FIG. 7, there is illustrated the exemplary structure of FIG. 6 after bonding the spalled material portion 10A to a substrate 24 in accordance with an embodiment of the present application. Any bonding process well known to those skilled in the art can be used to provide the structure shown in FIG. 7. In one example, the bonding process may be performed at 20° to 250° C., with or without the application of an external force. The substrate 24 may be flexible, or non-flexible. In some embodiments, the substrate 24 may be comprised of a semiconductor material. In other embodiments, the substrate 24 may be comprised of a dielectric material.

Referring now to FIGS. 8A and 8B, there are illustrated other exemplary handle substrates 20 that can be employed in the present application. The handle substrate 20 shown in FIG. 8A contains a metallization region 22, i.e., a conductive metal pad, located on a surface of the handle substrate 20. The handle substrate 20 shown in FIG. 8B contains metallization regions 22A (dual damascene) embedded within the material that provides the handle substrate 20, and metallization region 22B located on a surface of the handle substrate 20 and in contact with a portion of metallization region 22A.

Referring now to FIG. 9, there is illustrated another exemplary structure that can be formed utilizing the method of the present application. In this embodiment two base substrates were used and no edge exclusion materials were used. The exemplary structure shown in FIG. 9 is after spalling has been performed and it includes handle substrate 20, stressor layers 18L, 18R, and, if present the optional plating seed layers and the optional metal-containing adhesion layer 16L, 16R and a first spalled material portion 10L and a second spalled material portion 10R. In some embodiments, the stressor layers 16L, 16R comprise a same stressor material. In another embodiments, stressor layers 16L, 16R comprise different stressor materials. In some embodiments, each optional plating seed layer may comprise a same or different plating seed material. In yet a further embodiment, optional metal-containing adhesion layers 16L, 16R comprise a same or different material. The structure shown in FIG. 9 can be bonded to one or more other substrates.

The present application can be used in fabricating various types of thin-film devices including, but not limited to, semiconductor devices, photovoltaic devices, and electronic and optoelectronic devices that are flexible.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a spalled material portion of a base substrate;
   a stressor layer located above the spalled material portion of the base substrate; and
   a handle substrate comprising a flexible material and at least one metallization region,
   wherein the at least one metallization region is in contact with a surface of the stressor layer and partially extends through the flexible material of the handle substrate.

2. The structure of claim 1, further comprising an edge exclusion material on a topmost surface and at each vertical edge of the base substrate.

3. The structure of claim 2, further comprising a metal-containing adhesion layer disposed between the stressor layer and the base substrate.

4. The structure of claim 1, wherein the at least one metallization region is a single damascene structure, a dual damascene structure, a conductive metal pad or any combination thereof.

5. The structure of claim 1, wherein the handle substrate has a length that extends beyond a length of the base substrate.

6. The structure of claim 1, further comprising a substrate located beneath and in contact with the spalled material portion of the base substrate.

7. The structure of claim 1, wherein the flexible material has a radius of curvature of less than 30 cm.

8. A structure comprising:
a spalled material portion of a base substrate;
a stressor layer located above the spalled material portion of the base substrate; and
a handle substrate comprising a flexible material and at least one metallization region, wherein the at least one metallization region is in contact with a surface of the stressor layer and has a topmost surface that is coplanar with a topmost surface of the flexible material of the handle substrate.

9. The structure of claim 8, further comprising an edge exclusion material on a topmost surface and at each vertical edge of the base substrate.

10. The structure of claim 9, further comprising a metal-containing adhesion layer disposed between the stressor layer and the base substrate.

11. The structure of claim 8, wherein the at least one metallization region is a single damascene structure, a dual damascene structure, a conductive metal pad or any combination thereof.

12. The structure of claim 8, wherein the handle substrate has a length that extends beyond a length of the base substrate.

13. The structure of claim 8, further comprising a substrate located beneath and in contact with the spalled material portion of the base substrate.

14. The structure of claim 8, wherein the flexible material has a radius of curvature of less than 30 cm.

15. A structure comprising:
a spalled material portion of a base substrate;
a stressor layer located above the spalled material portion of the base substrate; and
a handle substrate comprising a flexible material and at least one metallization region, wherein the at least one metallization region is in contact with a surface of the stressor layer and is a conductive metal pad that is present on a topmost surface of the flexible material of the handle substrate.

16. The structure of claim 15, further comprising an edge exclusion material on a topmost surface and at each vertical edge of the base substrate.

17. The structure of claim 16, further comprising a metal-containing adhesion layer disposed between the stressor layer and the base substrate.

18. The structure of claim 15, wherein the handle substrate has a length that extends beyond a length of the base substrate.

19. The structure of claim 15, further comprising a substrate located beneath and in contact with the spalled material portion of the base substrate.

20. The structure of claim 15, wherein the flexible material has a radius of curvature of less than 30 cm.

\* \* \* \* \*